United States Patent [19]
Yamada

[11] Patent Number: 5,296,680
[45] Date of Patent: Mar. 22, 1994

[54] AUTOMATIC REFLOW APPARATUS WITH PRESSURE EQUALIZATION MEANS

[75] Inventor: Osamu Yamada, Tokyo, Japan

[73] Assignee: Eightech Tectron Co., Ltd., Hachioji, Japan

[21] Appl. No.: 21,558

[22] Filed: Feb. 24, 1993

[30] Foreign Application Priority Data

Sep. 30, 1992 [JP] Japan .................................. 4-286965

[51] Int. Cl.⁵ ........................ H05K 13/04; B23K 3/04
[52] U.S. Cl. .................................................. 219/388
[58] Field of Search ................. 219/388; 228/219, 220, 228/232, 231

[56] References Cited

U.S. PATENT DOCUMENTS

| | | | |
|---|---|---|---|
| 3,882,596 | 5/1975 | Kendziora et al. .................. | 228/219 |
| 4,832,249 | 5/1989 | Ehler ..................................... | 228/219 |
| 5,154,338 | 10/1992 | Okuno et al. ......................... | 219/388 |

FOREIGN PATENT DOCUMENTS

56-74367 6/1981 Japan .
WO91/04824 4/1991 World Int. Prop. O. .

*Primary Examiner*—Bruce A. Reynolds
*Assistant Examiner*—John A. Jeffery
*Attorney, Agent, or Firm*—Finnegan, Henderson, Farabow, Garrett & Dunner

[57] ABSTRACT

An automatic soldering apparatus for soldering a printed circuit board includes a plurality of electronic elements mounted thereon to be soldered thereto. The apparatus is structured to have a first station provided with a first outer opening for enabling the printed circuit board to be transported therethrough into a heating chamber so as to be soldered therein and further provided with a first inner opening, a second station provided with a second outer opening for enabling the soldered printed circuit board to be transported therethrough out of the heating chamber, and further provided with a second inner opening, and a duct having one end opening and an opposite end opening, the one end opening being connected to the first inner opening of the first station and the opposite end opening being connected to the second inner opening of the second station, the areas of the first inner opening the one end opening being larger than the area of the first outer opening, and the areas of the second inner opening and the opposite end opening being larger than the area of the second outer opening.

6 Claims, 6 Drawing Sheets

AUTOMATIC REFLOW APPARATUS WITH PRESSURE EQUALIZATION MEANS

BACKGROUND OF THE INVENTION

The present invention relates to an automatic reflow soldering apparatus for soldering a printed circuit board having a plurality of electronic elements mounted thereon to be soldered thereto by use of a heated inert gas, and more particularly relates to such apparatus which is easily responsive to mild and rapid flows of the inert gas in the apparatus to prevent the inert gas from flowing out of the apparatus to thereby remarkably reduce the wasteful consumption of the inert gas.

According to the conventional automatic soldering apparatus, the printed circuit board has been soldered by a molten solder in the air containing much oxygen. In this method, the solder and the electronic elements to be soldered to the printed circuit board are exposed to the oxygen in a high temperature and therefore the soldered portions and the molten solder are easily oxidized. As the result, it has been very difficult to attain a sufficient soldering effect. It has been often required to take a troublesome work such as to remove the residues from the soldered printed circuit board.

Recently the electronic elements have been very small and the leads accordingly have been very fine and therefore a small defect such as the oxidization of soldered portions will decrease the reliability of the electronic goods.

For the purpose of solving such a problem, there has been proposed an automatic soldering apparatus in which the solder and the printed circuit board having the electronic elements mounted thereon are heated up to a high temperature in an inert gas such as the nitrogen gas so that the soldered portions and the molten solder will not be oxidized.

The inert gas such as the nitrogen gas to be employed in the apparatus of this kind is expensive, and it is required to tightly close up the apparatus so as to reduce the leaks of the inert gas from the apparatus to a minimum.

On the other hand, it is inevitable that such apparatus will transport the printed circuit board thereinto and transport the soldered printed circuit board out of apparatus. Regarding the automatic soldering apparatus, it has been very difficult to prevent the inert gas from flowing out of the apparatus at the openings through which the printed circuit board is transported into and out, of the apparatus. Actually it has been a observed that a higher amount of inert gas leaks from the apparatus uneconomically.

In short, it is generally known that the automatic reflow soldering apparatus, by way of example, is under control such that the temperature is progressively higher in a plurality of chambers, that is, from a preheating chamber to a reflow soldering chamber. Since the gas density is lighter in a higher temperature and is heavier in a lower temperature, the inert gas will constantly flow from the place of a lower temperature to the place of higher temperature. This flow of inert gas due to the difference of temperatures will cause the gas leak at the exit of the printed circuit board in the soldering apparatus.

Further the gas leak at the exit will cause the outer air to flow into the apparatus at the entrance of the printed circuit board in the apparatus resulting in a dilution of the inert gas within the apparatus and lowering the oxidization resistant effect. It is therefore apparent that a desired soldering effect can not be attained.

The flow of the inert gas from the chamber of a lower temperature to the chamber of a higher temperature is not always constant. The flow is more or less varied due to the soldering conditions in the automatic soldering apparatus. Such a slight change of the flow will cause the inert gas to leak from the entrance or the exit of the apparatus.

As is generally known, the automatic soldering apparatus has a ventilator provided in each of the preheating chambers and also in the reflow soldering chamber for the purpose of circulating the highly heated inert gas from up to down so that the inert gas may be blown to the upper surface of the printed circuit board to be soldered. The inert gas blown against the upper surface of the printed circuit board will partly flow in the opposite directions as the printed circuit board is transported. This further results in increasing the leaks of the inert gas.

Further just when the printed circuit board is transported at the entrance into the blown and circulated inert gas in the preheating chamber, a part of the inert gas will rapidly flow toward the entrance along the upper surface of the printed circuit board, and flows out of the entrance and is thus consumed. The same consumption phenomenon is caused when the print circuit board is transported out of a cooling chamber. Namely a part of the inert gas will rapidly flow out of the exit of the soldering apparatus.

A device has been proposed to increase the supply the inert gas to increase the pressure in the soldering apparatus so as to prevent the air from flowing into the apparatus. Such a method will require a considerable amount of inert gas and is not economical. In fact, such a method may be effective to maintain a constant flow of inert gas in the direction from the chamber of a lower temperature to the chamber of a higher temperature, but is not enough to control the rapid change of the inert gas flow.

Actually from the economical reason, a device is required to adjust the supplied amount of inert gas so as to reduce the consumption of inert gas to a minimum which may flow out of the soldering apparatus. However the device will not sufficiently respond to the influence of a strong outer air flow into the soldering apparatus at the entrance or the exit thereof through which the printed circuit board is transported into or out of the apparatus. This will adversely influence the soldering effect of the printed circuit board.

The present invention has been provided to eliminate the defects and disadvantages of the prior art. It is the principal object of the invention to provide a duct which has a front end opening and a rear end opening which are connected to a front station and a rear station of a soldering apparatus respectively through which the printed circuit board is transported into and out of the soldering apparatus, the areas of the front and rear openings of the duct being larger than the areas of the entrance and the exit of the soldering apparatus, so that the pressures within the front and rear stations may be constantly maintained equal to thereby prevent unnecessary flows of the inert gas and to thereby prevent the inert gas from flowing out of the entrance and the exit of the soldering apparatus.

It is another object of the invention to provide a first inert gas supplying device on the side of the front end of the duct and a second inert gas supplying device on the side of the rear end of the duct so as to control the amount of inert gas to be supplied into the front and rear stations of the soldering apparatus in response to the change of air flows therein, to thereby control the flow of inert gas in the soldering apparatus and thus to remarkably reduce the consumption of inert gas.

It is still another object of the invention to supply the inert gas through the duct into the front station or into the rear station when the inert gas in the preheating chamber flows rapidly to the entrance of the printed circuit board or when the inert gas in the cooling chamber flows rapidly to the exit of the print circuit board to thereby control the rapid flows of inert gas in the soldering apparatus and to thereby prevent the inert gas from flowing out of the soldering apparatus at the entrance and the exit thereof and further to thereby reduce the change of inert gas density to a minimum in the soldering apparatus, and thus to maintain the effective soldering performance of the apparatus and simultaneously to reduce the consumption of the inert gas.

SUMMARY OF THE INVENTION

In short, the invention relates to an automatic soldering apparatus for soldering a printed circuit board having a plurality of electronic elements mounted thereon to be soldered thereto by transporting the printed circuit board through a heating chamber having an inert gas filled therein, the invention comprising a first station arranged on one side of the heating chamber and provided with a first outer opening for enabling the printed circuit board to be transported therethrough into the heating chamber so as to be soldered therein and further provided with a first inner opening, a second station arranged on the opposite side of the heating chamber and provided with a second outer opening for enabling the soldered printed circuit board to be transported therethrough out of the heating chamber and further provided with a second inner opening, and a duct having one end opening and the opposite end opening, the one end opening being connected to the first inner opening of the first station and the opposite end opening being connected to the second inner opening of the second station, the first inner opening of the first station had the one end opening of the duct having an area larger than the area of the first outer opening of the first station and the second inner opening of the second station and the opposite end opening of the duct having an area larger than the area of the second outer opening of the second station.

As another aspect of the invention further comprising a first sensor arranged in the first station to detect an air flowing condition in the first station and producing a first detection signal, a second sensor arranged in the second station to detect an air flowing condition in the second station and producing a second detection signal, a first inert gas supplying means actuated in response to the first detection signal to control an amount of the inert gas to be supplied into the duct in the neighborhood of the one end opening thereof, and a second inert gas supplying means actuated in response to the second detection signal to control an amount of the inert gas to be supplied into the duct in the neighborhood of the opposite opening thereof.

The other features and advantages of invention will be apparent from the detailed description of the invention in reference to the preferred embodiments as shown in the attached drawings.

BRIEF DESCRIPTION OF THE DRAWINGS

FIGS. 1–4 relate to a first embodiment of the invention, in which,

FIGS. 5–8 relate to a second embodiment of the invention, in which,

DETAILED DESCRIPTION OF THE INVENTION

The invention will now be described in reference to the preferred embodiments as shown in the attached drawings. In reference to FIGS. 1–8, an automatic reflow soldering apparatus 1, which is an example of the invention, is substantially composed of a duct 2, a sensor 3 for detecting a printed circuit board 12 to be transported into the duct 2, another sensor 4 for detecting the printed circuit board 12 to be transported out of the duct 2, an inert gas supplying device 5 and another inert gas supplying device 6.

In reference to FIGS. 1–4, the automatic reflow soldering apparatus 1 as a first embodiment of the invention is provided with a housing 6 having a basic structure of the apparatus. The housing 6 is divided with a plurality of walls 8 to provide preheating chambers PH1, PH2, a reflow soldering chamber RF and a cooling chamber CL all of which forming a heating chamber 9. Each of the chambers is of the same structure except for difference of temperature therein.

A front station 11 through which the printed circuit board 12 to be soldered is transported into the heating chamber 9 is provided adjacent the preheating chamber PH1, and a rear station 13 through which the soldered printed circuit board 12 is transported out of the heating chamber 9 is provided adjacent the cooling chamber CL, the front and rear stations 11, 13 being partitioned with the walls 8 from the preheating chamber PH1 and the cooling chamber CL respectively.

Figure 2:
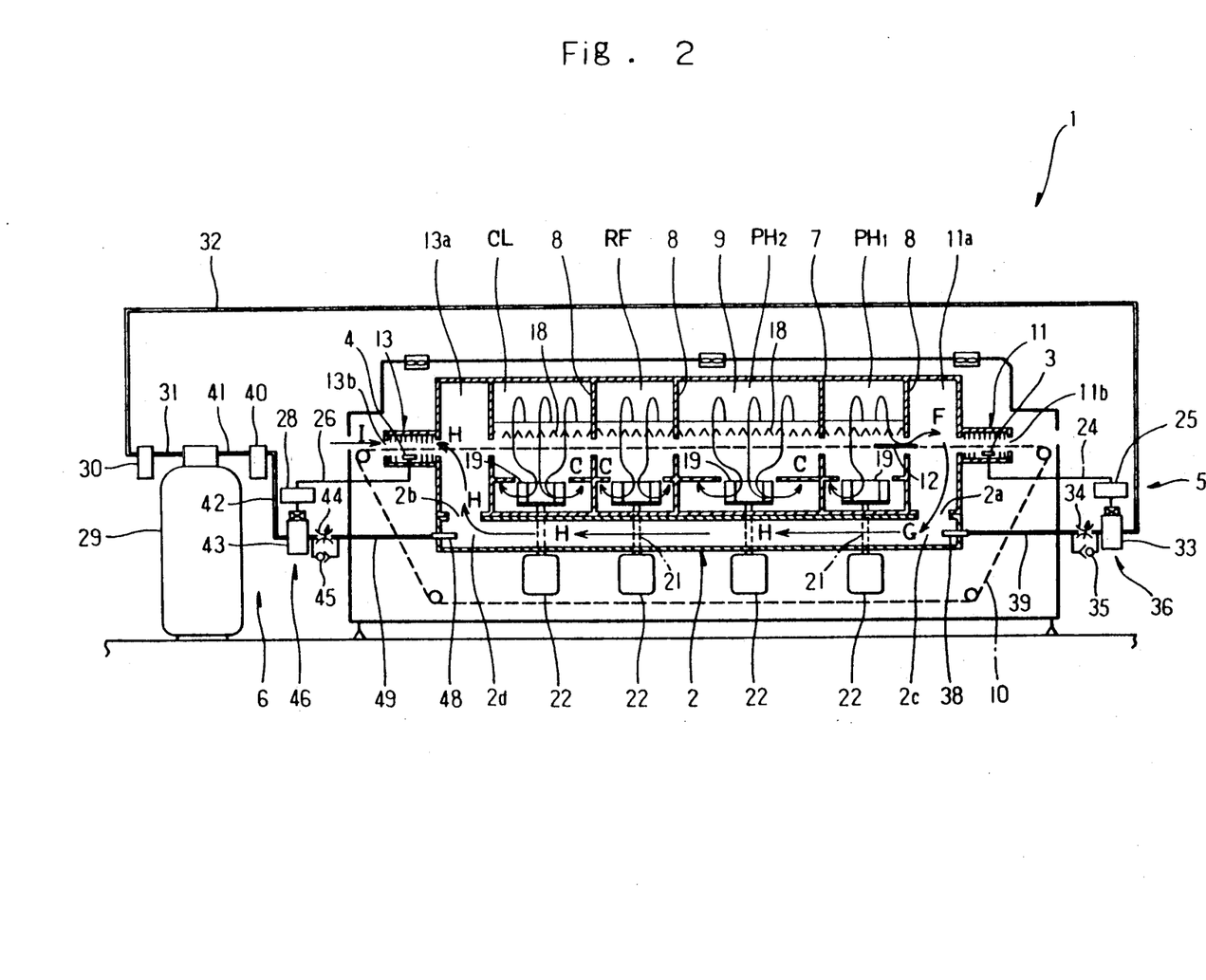
FIG. 2 is the same with FIG. 1 with an exception showing the flows of inert gas in the soldering apparatus.
Figure 3:
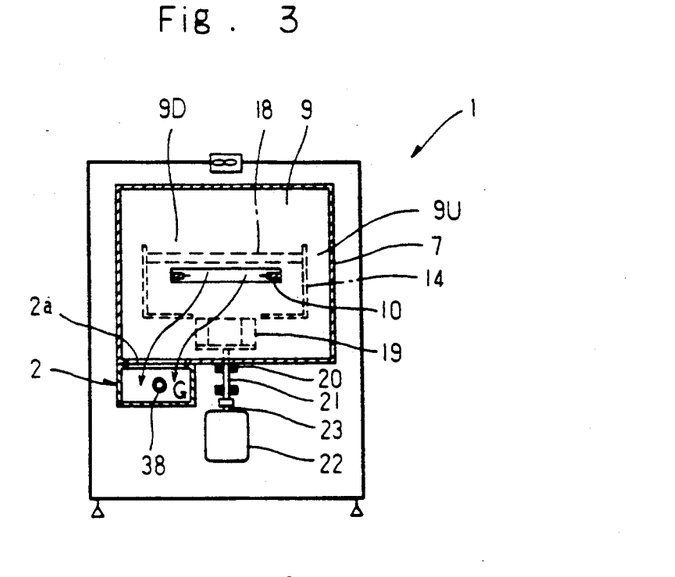
FIG. 3 is a front elevational view of the automatic soldering apparatus shown in vertical section.
Figure 4:
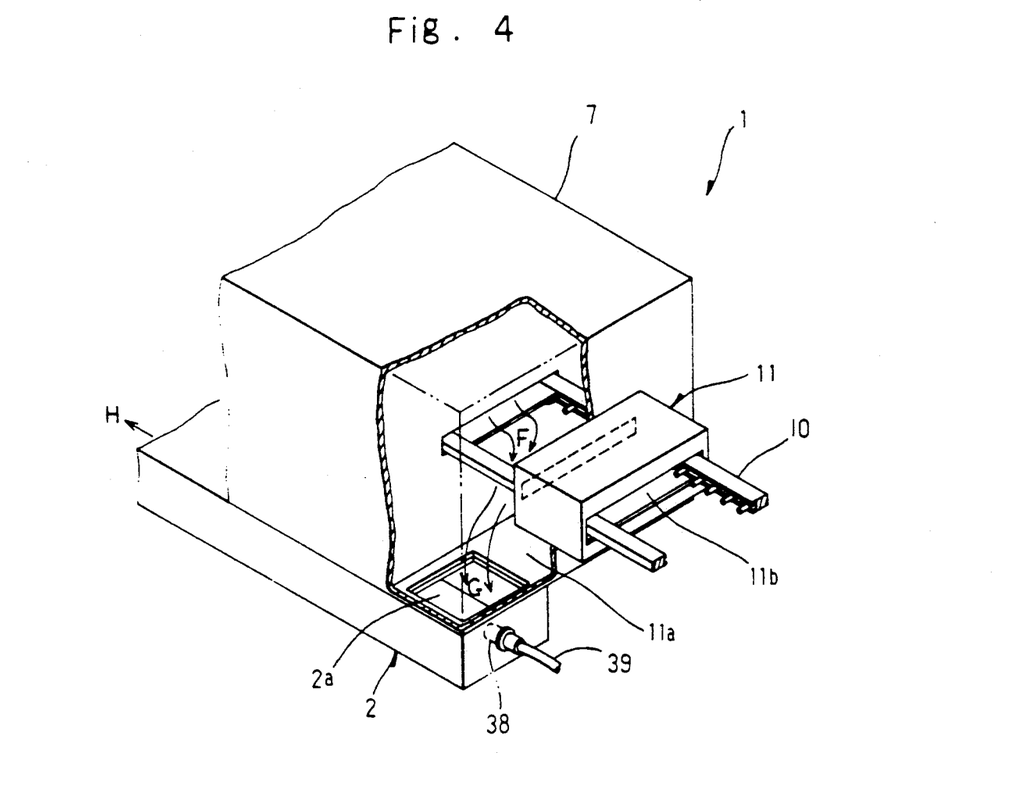
FIG. 4 is a perspective view of a part of the soldering apparatus shown partly broken.

A generally known endless chain conveyor 10, which is an example of a transporting device, is arranged in such a manner as is extended through all of the front station 11, the preheating chambers PH1, PH2, the reflow soldering chamber RF, the cooling chamber CL and the rear station 13. The conveyor 10 is operated to transport the printed circuit board 12 through the front station 11, the preheating chambers PH1, PH2, the reflow soldering chamber RF and the rear station 13 progressively from right to left as shown in FIG. 2.

A casing 14 is provided in each of the preheating chambers PH1, PH2, the reflow soldering chamber RF and the cooling chamber CL which are filled with an inert gas such as a nitrogen gas respectively. Between the casing 14 and the wall 7 of the heating chamber 9 channels 9U are provided through which the inert gas flows up, and in the casing 14 another channel 9D is provided through which the inert gas flows down.

The casing 14 has a heating device 18 provided at the top thereof and above the chain conveyor 10 which is extended through the casing 14. The heating device 18 is of a sandwiched type having a heater sandwiched with upper and lower perforated metal plates, and is controlled to heat the preheating chamber PH1 up to about 190° C., the preheating chamber PH2 up to about 150° C., the reflow soldering chamber RF up to 250° C. and the cooling chamber up to 130° C.

The printed circuit board 12 carried on the chain conveyor 10 is transported thereby through the preheating chambers PH1, PH2 to be preheated therein as is transported,, and then is heated in the reflow soldering chamber RF rapidly up to a soldering temperature, and is progressively cooled down in the cooling chamber CL, and then is transported out of the rear station 13.

A ventilator 19 is provided at a lower part in each of the preheating chambers PH1, PH2, the reflow soldering chamber RF and the cooling chamber CL so as to circulate the inert gas filled in each of the chambers as mentioned. The ventilator 19 may be a sirocco type centrifugal fan. The ventilator 19 has a shaft 21 supported by a bearing 20 such as a ball bearing and connected to a rotation shaft 23 of as electric motor 22, to be driven thereby. The electric motor being located on the outside of each of the chambers.

The ventilator 19 is driven to absorb the nitrogen gas, which comes up through the circulation channel 9U in the heating chamber 9, down through the circulation channel 9D and through the heating device 18 so that the nitrogen gas heated by the heating device 18 will heat the printed circuit board 12 while the board 12 is transported by the chain conveyor 10. Then the ventilator 19 will circulate the nitrogen gas up through the circulation channel 9U again. Thus the nitrogen gas is progressively heated up to a temperature for soldering the print circuit board 12 so that the electronic elements (not shown) will be soldered to the print circuit board 12.

The duct 2 is a path for providing equivalent inner pressures within a front chamber 11a of the front station 11 and within a rear chamber 13a of the rear station 13, and is arranged on the underside of the housing 6 to connect the front and rear chambers 11a, 13a. More precisely the duct 2 has a front opening 2a and a rear opening 2b which are connected to a front opening 11b of the front chamber 11a and a rear opening 13b of the rear chamber 13a respectively and which are of the areas considerably larger than the areas of the front and rear openings 11b and 13b respectively so that the nitrogen gas way flow between the front and rear stations 11 and 13 through the duct 2.

The sensor 3 is provided in the front station 11 and may be a generally known wind gauge, a thermometer, a nitrogen density gauge or a pressure gauge which is electrically connected to an electronic circuit 25 through an electric line 24 to detect an air current in the front station and to produce a detection signal. The sensor 4 is provided in the rear station 13 and may be a generally known wind gauge, a thermometer, a nitrogen density gauge or a pressure gauge which is electrically connected to an electronic circuit 28 through an electric line 26 to detect an air current in the rear station 13 and to produce a detection signal.

An inert gas supplying device 5 is provided to supply the nitrogen gas into a front part 2c of the duct 2. The inert gas supplying device 5 has a gas cylinder 29 containing fluid nitrogen and connected to a carburetor 30 through a pipe 13. The carburetor 30 is connected through a pipe 32 to an air compressor circuit 36 which is composed of the electronic circuit 25 for performing a PID control in response to a detection signal issued from the sensor 3 in the front station 11, an air compression regulator 33, an air flow control value 34 and a check valve 35 which are responsive to a control signal from the electronic circuit 25 to control the nitrogen gas pressure.

The air compressor circuit 36 is connected through a pipe 39 to a nozzle 38 secured to the front part 2c of the duct 2, and is operated to lead the fluid nitrogen gas in the gas cylinder 29 into the carburetor 30 through the pipe 31 to evaporate the fluid nitrogen therein into the nitrogen gas, and then to control a flow of the nitrogen gas through the air compression regulator 33 and the air flow control valve 34, and then to supply the controlled nitrogen gas into the duct 2 through the nozzle 38 as shown by arrow marks A.

Another inert gas supplying device 6 is provided to supply the nitrogen gas into a rear part 2d of the duct 2. The inert gas supplying device 6 has the gas cylinder 29 connected through a pipe 41 to a carburetor 40 which is connected to an air compressor circuit 46. More precisely the air compressor circuit 46 has an air compression regulator 43 connected to the air compressor 40 through a pipe 42 and an electronic circuit 28 which is responsive to the detection signal issued from the sensor 4 in the rear station to perform a PID control and produce a control signal for enabling the air compression regulator 43, an air flow control valve 44 and a check valve 45 to control the nitrogen gas pressure.

The air compressor circuit 46 is connected through a pipe 49 to a nozzle 48 secured to the rear part 2d of the duct 2 and is operated to lead the fluid nitrogen in the gas cylinder 29 into the carburetor 40 through the pipe 41 to evaporate the fluid nitrogen into the nitrogen gas therein, and then to control the flow of nitrogen gas through the air compression regulator 43 and the air flow control valve 44 to thereby supply the nitrogen gas through the nozzle 48 into the rear part 2d of the duct 2 as shown by arrow marks B.

FIGS. 5 through 8 show a second embodiment of the invention which is the same as the first embodiment as mentioned above with the exception that the ventilator 19 is a propeller type fan driven by the electric motor 22, and is provided at an upper part in each of the preheating chambers PH1, PH2, the reflow soldering chamber RF and the cooling chamber CL. The same parts are indicated by the reference numerals and marks with those of the first embodiment and the explanation is omitted.

The invention is structured as mentioned above and the operation is as follows: In reference to FIG. 1 (first embodiment) and FIG. 5 (second embodiment), the nitrogen gas within the preheating chambers PH1, PH2, the reflow soldering chamber RF and the cooling chamber CL is circulated in the directions as shown by arrow marks C by operation of the ventilators 19 driven by the electric motors 22 respectively to thereby maintain the respective chambers at predetermined temperatures.

Figure 1:
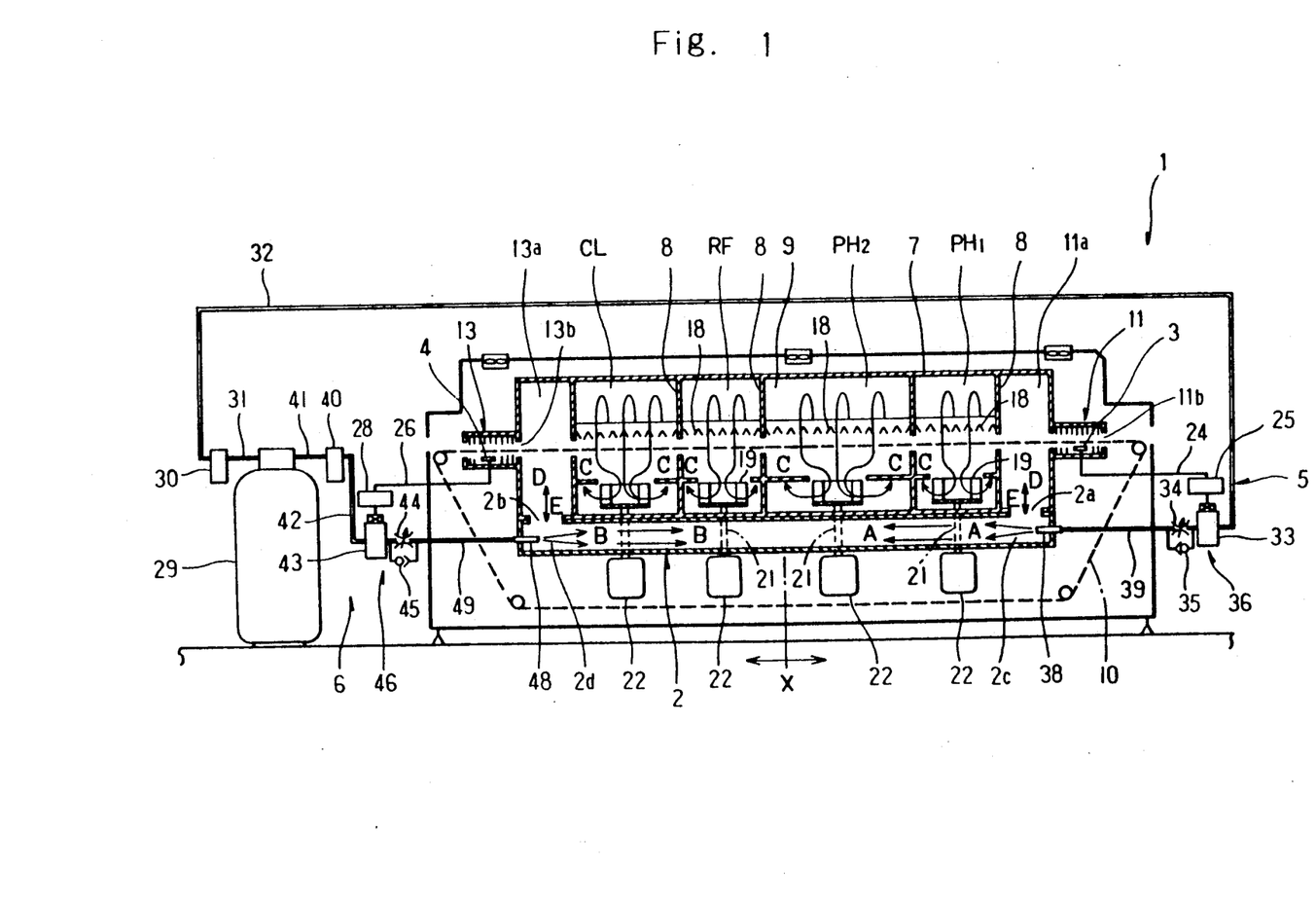
FIG. 1 is a side elevational view of an automatic soldering apparatus shown in vertical section including an inert gas supplying circuit.
Figure 5:
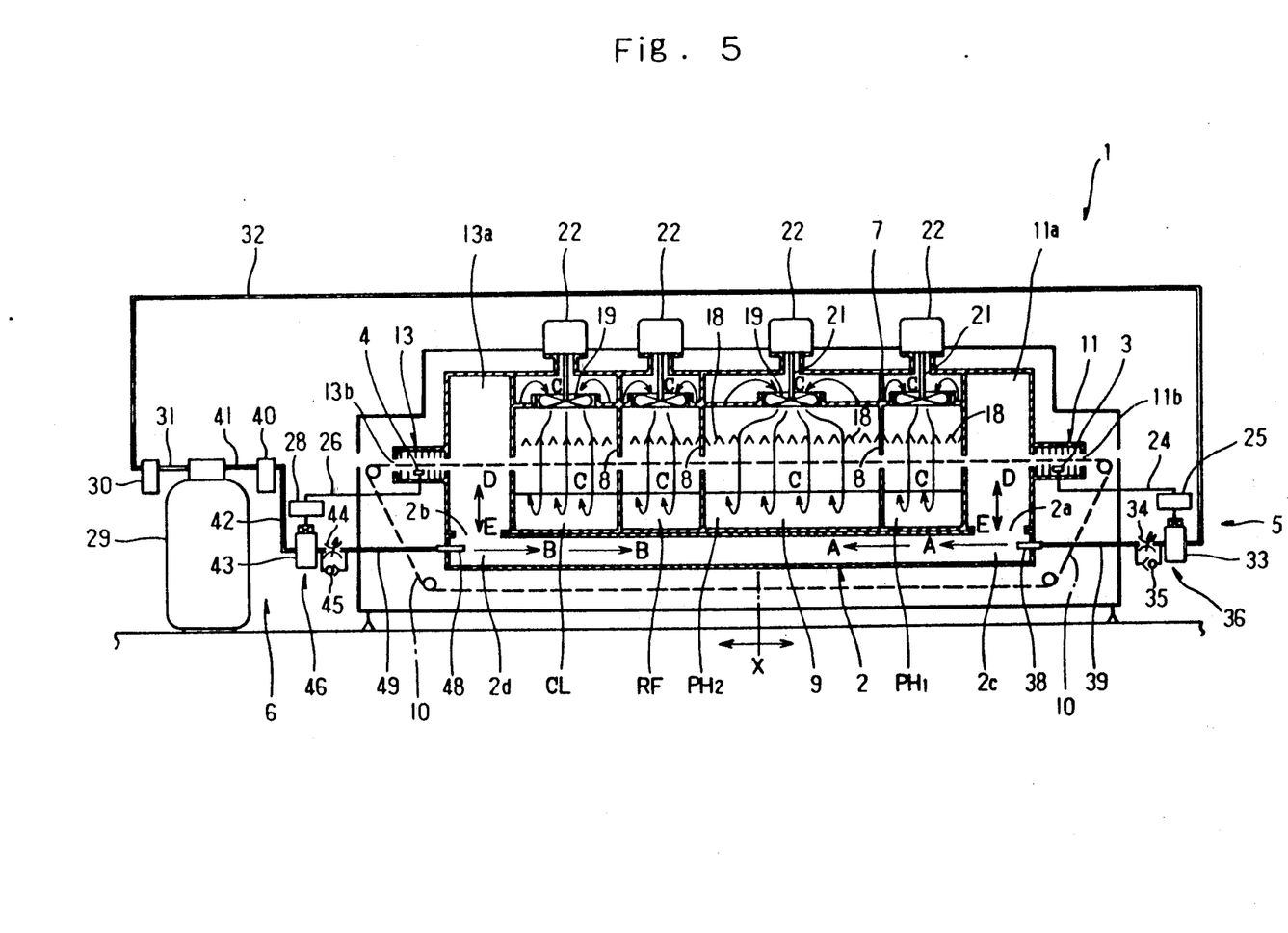
FIG. 5 is a side elevational view of an automatic soldering apparatus shown in the same manner with FIG. 1.

The automatic reflow soldering apparatus 1 is so controlled as to progressively raise a temperature from the preheating chamber PH1 to the reflow soldering chamber RF. Therefore the nitrogen gas, which is relatively of heavier density in the preheating chamber of a lower temperature, will flow toward the reflow soldering chamber RF of a higher temperature in which the inert gas is relatively of lighter density. However the nitrogen gas is supplied under control from the first and second inert gas supplying devices 5, 6 into the front and rear parts 2c, 2d of the duct 2 so that the pressures within the front and rear stations 11, 13 may be balanced to stop the flows of nitrogen gas at the point X. Under this condition, the nitrogen gas in the front and rear chambers 11a, 13a of the respective stations 11, 13 is almost at a standstill although the nitrogen gas is more or less movable in the directions as shown by arrow marks D and E. This control is performed by making constant the flowing amount of nitrogen gas supplied from the nozzle 48 the second inert gas supplying device into the rear part 2d of the duct 2 in the direction as shown by the arrow marks B while adjustable is the nitrogen gas supplied from the nozzle 38 of the first inert gas supplying device 5 into the front part 2c of the duct 2 in the direction as shown by the arrow marks A.

Figure 6:
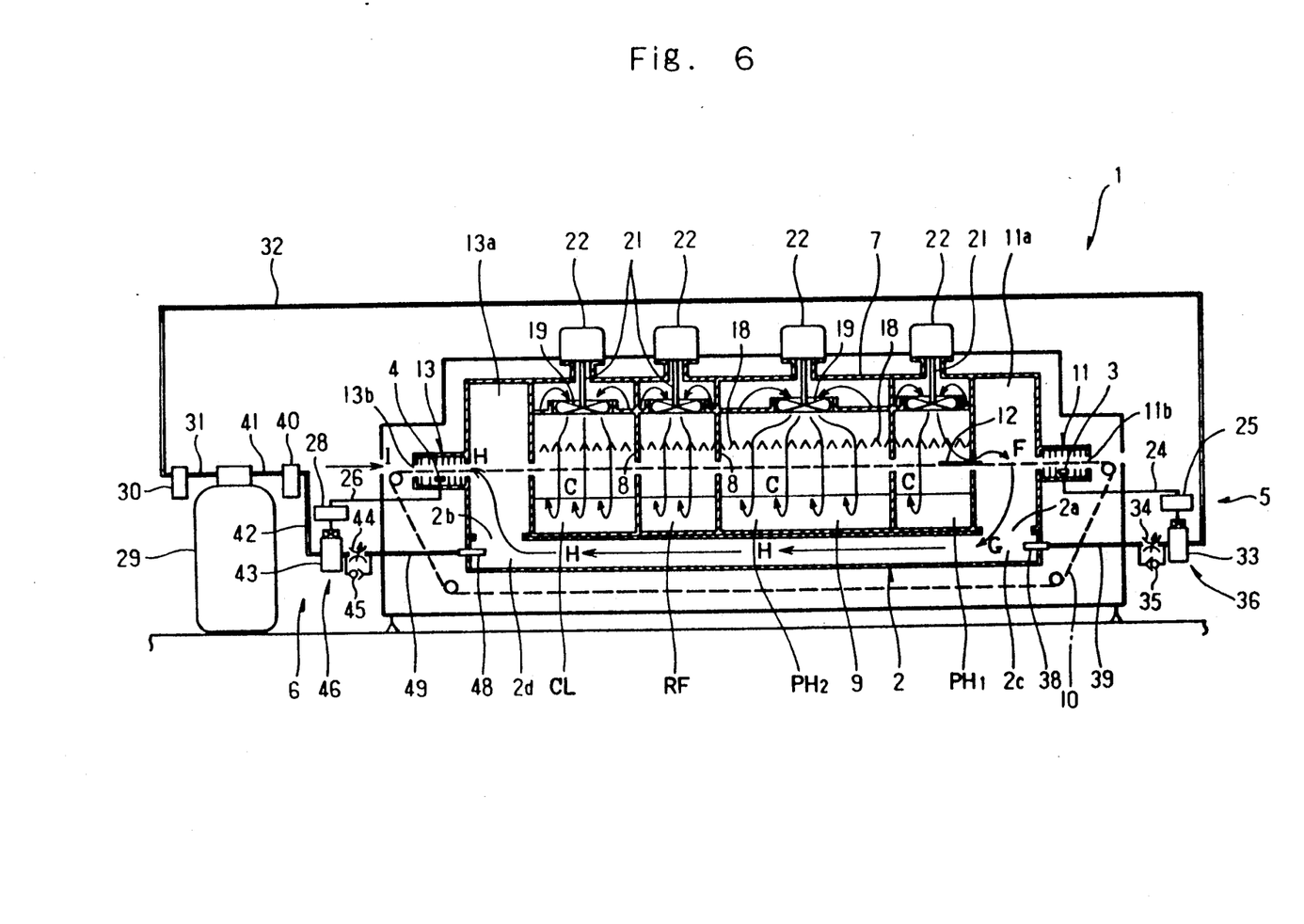
FIG. 6 is the same with FIG. 5 with an exception showing the flows of inert gas in the soldering apparatus.
Figure 7:
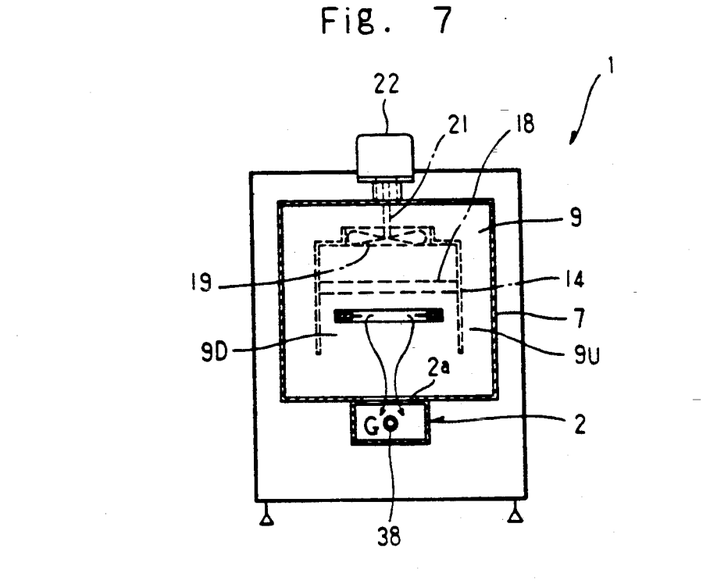
FIG. 7 is a front elevational view of the soldering apparatus shown in vertical section.
Figure 8:
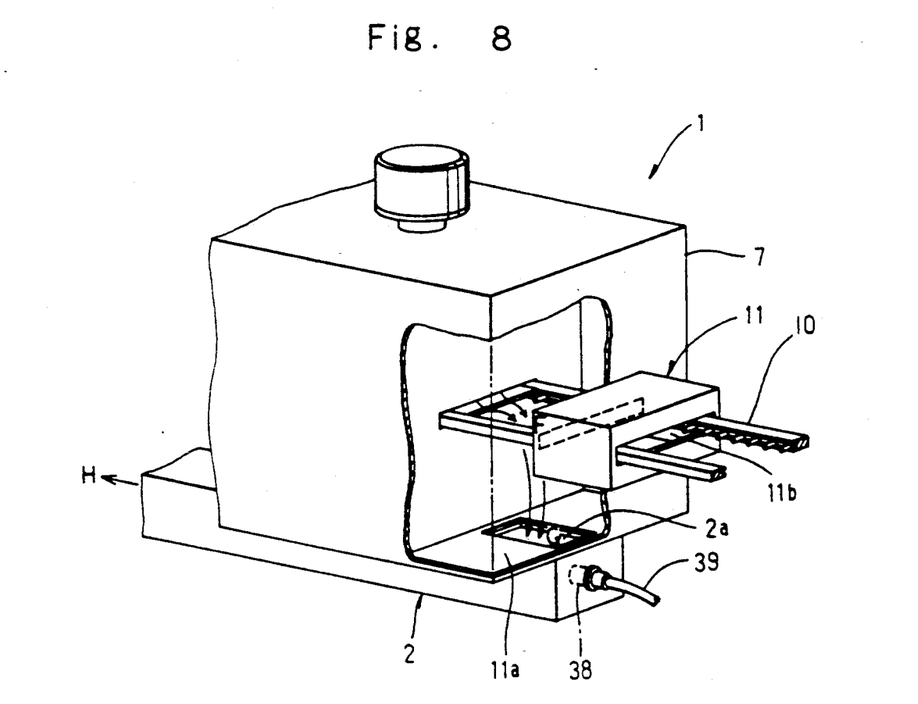
FIG. 8 is a perspective view of a part of the soldering apparatus shown partly broken.

Further in reference to FIGS. 2 and 6, the printed circuit board 12 is placed on the chain conveyor 10 at the front opening 11b of the front station 11, and then is transported in the leftward direction as shown into the preheating chamber PH1, where the nitrogen gas is heated up to about 190° C. by the heating device 18 and flows from up to down to contact the printed circuit board 12 due to operation of the ventilator 19 to thereby rapidly heat the same. The comparatively small electronic elements (not shown) to be soldered to the printed circuit board 12, which are of a small heat capacity, will be soon heated up to the same temperature with the nitrogen gas of about 190° C. However the comparatively large electronic elements, which are of large heat capacity, will remain with a substantially lower temperature although the outer surfaces of which may be heated up to about 190° C.

Subsequently the printed circuit board 12 is transported into the next preheating chamber PH2 where the nitrogen gas is heated up to about 150° C. by the heating device 18. In this chamber PH2, the electronic elements of smaller heat capacity will be reduced in the temperature thereof, but the electronic elements of larger heat capacity and the printed circuit board 12 carrying the same will be further heated up gradually and substantially come up to about 150° C. Namely the printed circuit board 12 will be wholly heated up 150° C. Thus the preheating treatment of the printed circuit board 12 is finished.

As mentioned above, the nitrogen gas is heated up to a high temperature in each of the chambers and is sent down by the ventilator 19 to thereby contact the printed circuit board 12 at the upper side thereof to heat the same. The nitrogen gas further flows down through the chain conveyor 10 and is absorbed by the ventilator 19 and then flows in the opposite directions and up into the circulation channels 9U as shown in FIGS. 1 through 3 and FIGS. 5 through 7 and returns up to above the heating device 18.

Simultaneously the temperature of nitrogen gas is detected by a sensor (not shown) and the detection signal is issued from the sensor transmitted to a control device (not shown) which is designed to control the electric power to be supplied to the heating device 18 to maintain a predetermined temperature of the nitrogen gas.

Subsequently the printed circuit board 12 is transported into the reflow soldering chamber RF, where the nitrogen gas is heated up to about 250° C. and flows in the same courses with the preheating chambers PH1, PH2 to further heat up the printed circuit board 12. A cream solder is then melted to solder the electronic elements to the printed circuit board 12 at the predetermined positions thereof.

The soldered printed circuit board 12 with the high temperature is subsequently transported into the cooling chamber CL, where the nitrogen gas is heated up to about 130° C. to progressively cool down the highly heated printed circuit board 12. The cooled down printed circuit board 12 is then transported out of the cooling chamber CL and into the rear station 13 and is transported out of the rear opening 13b of the rear station 13. Thus the soldering treatment of the printed circuit board 12 is finished.

As mentioned hereinbefore, the inert gas will flow from the preheating chamber PH1, where the inert gas is of a heavier density with a relatively lower temperature, to the reflow soldering chamber RF, where the inert gas is of a lighter density with a relatively higher temperature since the automatic reflow soldering apparatus is under a control for progressively raising the temperature from the preheating chamber PH1 to the reflow soldering chamber RF.

Further the inert gas around the chain conveyor 10 will flow in the same direction as the conveyor moves from right to left in FIGS. 1, 2, 5 and 7.

The flow out of nitrogen gas at the rear opening 13b of the rear station will reduce the pressure within the front chamber 11a and allow the outer air to come into the automatic reflow soldering apparatus 1 resulting in reduction of the nitrogen gas density in the heating chamber 9. The sensor 3 in the front station 11 is responsive to the air flow at the front opening 11b to produce a detection signal to the electronic circuit 25 through the line 24.

The electronic circuit 25 is responsive to the detection signal to lead the fluid nitrogen in the gas cylinder 29 into the carburetor 30 through the pipe 31 in which the fluid nitrogen is evaporated into the nitrogen gas. The electronic circuit 25 will further operate the air compression regulator 33 and the air flow control valve 34 to control the amount of nitrogen gas to be supplied into the front part 2c of the duct 2 through the nozzle 38 as shown by the arrow marks A, to thereby increase the pressure within the front chamber 11a of the front station 11 so that the outer air is prevented from flowing into the heating chamber 9 at the front opening 11b and accordingly the presence of little oxygen may be maintained within the automatic reflow soldering apparatus 1.

On the other hand, it may happen that the nitrogen gas will flow out of the front opening 11b of the front station for same reason. In this case, the outer air will flow into the heating chamber 9 at the rear opening 13b of the rear station 13. The sensor 4 in the rear station 13 is responsive to the air flow at the rear opening 13b to produce a detection signal to the electronic circuit 28 through the line 26. The electronic circuit 28 is responsive to the detection signal to lead the fluid nitrogen in the gas cylinder 29 into the carburetor 40 through the pipe 41 in which the fluid nitrogen is evaporated into the nitrogen gas. The electronic circuit 28 will further operate the air compression regulator 43 and the air flow control valve 44 to control the amount of nitrogen gas to be supplied into the rear part 2d of the duct 2 through the nozzle 48 as shown by the arrow marks B, to thereby increase the pressure within the rear chamber 13a of the rear station 13 so that the outer air is prevented from flowing into the heating chamber 9 at the rear opening 13b.

As mentioned above, the mild flow of nitrogen gas within the automatic reflow soldering apparatus 1 is under control by appropriately regulating the nitrogen gas flowing amount to be supplied into the front and rear parts 2c, 2d of the duct 2 through the nozzles 38, 48 of the first and second inert gas supplying devices 5, 6 so that the pressures within the front and rear stations 11, 13 may be balanced. As the result, the flows of nitrogen gas are stopped at the point X in FIGS. 1 and 5. This will save the consumption of nitrogen gas to the minimum.

Actually as shown in FIGS. 2 and 6, when the printed circuit board 12 is transported into the preheating chamber PH1 at the initial stage of the soldering operation, the nitrogen gas flowing down will contact the upper side of the printed circuit board 12 and then a part of the nitrogen gas will rapidly flow in the direction as shown by arrow mark F and into the front chamber 11a of the front station 11 resulting in increase of the pressure within the front chamber 11a, and will otherwise flow out of the front station 11 at the front opening 11b and accordingly the outer air will flow into the rear station 13 at the rear opening 13b.

However according to the invention, the nitrogen gas will not flow out of the front opening 11b of the front station 11. Actually the nitrogen gas flowing into the front chamber 11a will flow down in the direction as shown by arrow mark G and into the front part 2c of the duct 2 at the front opening 2a thereof which has an area much larger than that of the front opening 11b of the front station 11. The nitrogen gas will further flow in the direction as shown by the arrow marks H in the duct 2 and flow into the rear chamber 13b of the front station 13 resulting in increase of the pressure therein to prevent the outer air from flowing in the direction as shown by arrow mark I and into the rear station 13.

Similarly in the last stage of the soldering operation, when the soldered printed circuit board 12 is transported out of the cooling chamber CL and into the rear chamber 13a of the rear station 13, the nitrogen gas flowing down will contact the upper side of the soldered printed circuit board 12 and then a part of the nitrogen gas will rapidly flow out of the cooling chamber CL and into the rear chamber 13a resulting in increase of the pressure therein. This will cause the outer air to flow into the front station 11 at the front opening 11b thereof. However the nitrogen gas coming out of the cooling chamber CL flows into the duct 2 in the direction opposite to the direction shown by the arrow marks H. As the result, the pressure within the front chamber 11a of the front station is increased and the outer air is prevented from flowing into the front chamber 11a. Thus the consumption of the nitrogen gas is reduced.

As mentioned above, according to the invention, the automatic reflow soldering apparatus 1 is designed to appropriately respond to any variations of flows of nitrogen gas which may be mild or rapid to thereby prevent a wasteful consumption of the nitrogen gas.

The invention has been described in reference to an automatic reflow soldering apparatus. However it is apparent that the invention may be easily applied as well to the other types of automatic soldering apparatuses such as the jetting and dipping types of automatic soldering apparatuses.

What we claim is:

1. An automatic reflow soldering apparatus for soldering a printed circuit board having a plurality of electronic elements mounted thereon to be soldered thereto by transporting the printed circuit board through a heating chamber having an inert gas filled therein, said apparatus comprising: a first station chamber arranged on one side of the heating chamber and provided with a first outer opening for enabling the printed circuit board to be transported therethrough into the heating chamber so as to be soldered therein, said first station chamber being further provided with a first inner opening; a second station chamber arranged on the opposite side of the heating chamber from said first station chamber and provided with a second outer opening for enabling the soldered printed circuit board to be transported therethrough out of the heating chamber, said second station chamber being further provided with a second inner opening; and a duct to establish a path for equalizing pressures within aid first and second station chambers, said duct having a one end opening and an opposite end opening, said one end opening connected to the first inner opening of the first station chamber and said opposite end opening connected to the second inner opening of the second station chamber, said first inner opening and said one end opening having an area larger than the area of said first outer opening of the first station chamber, and said second inner opening and said opposite end opening having an area larger than the area of said second outer opening of the second station chamber.

2. An automatic reflow soldering apparatus for soldering a printed circuit board having a plurality of electronic elements mounted thereon to be soldered thereto by transporting the printed circuit board through a heating chamber having an inert gas filled therein, said apparatus comprising: a first station arranged on one side of the heating chamber and provided with a first outer opening for enabling the printed circuit board to be transported therethrough into the heating chamber so as to be soldered therein, said first station being further provided with a first inner opening; a second station arranged on the opposite side of the heating chamber from said first station and provided with a second outer opening for enabling the soldered printed circuit board to be transported therethrough out of the heating chamber, said second station being further provided with a second inner opening; a duct having one end opening and an opposite end opening, said one end opening connected to the first inner opening of the first station and said opposite end opening connected to the second inner opening of the second station, said first inner opening and said one end opening having an area larger than the area of said first outer opening of the first station, and said second inner opening and said opposite end opening having an area larger than the area of said second outer opening of the second station; a first sensor arranged in said first station to detect an air flowing condition in said first station and producing a first detection signal; a second sensor arranged in said second station to detect an air flowing condition in said second station and producing a second detection signal; a first inert gas supplying means actuated in response to the first detection signal to control an amount of the inert gas to be supplied into the duct adjacent to said one end opening thereof; and a second inert gas supplying means actuated in response to the second detection signal to control an amount of the inert gas to be supplied into the duct adjacent to the opposite end opening thereof.

3. The apparatus as defined in claim 2, wherein said first and second sensors are wind gauges respectively.

4. The apparatus as defined in claim 2, therein said first and second sensors are thermometers respectively.

5. The apparatus as defined in claim 2, wherein said first and second sensors are nitrogen density gauges respectively.

6. The apparatus as defined in claim 2, wherein said first and second sensors are pressure gauges respectively.

* * * * *

UNITED STATES PATENT AND TRADEMARK OFFICE
CERTIFICATE OF CORRECTION

PATENT NO. : 5,296,680
DATED : March 22, 1994
INVENTOR(S) : Osamu Yamada

It is certified that error appears in the above-indentified patent and that said Letters Patent is hereby corrected as shown below:

Claim 1, column 10, line 31, "aid" should be ---said---; and line 32, delete the word "a".

Claim 4, column 12, line 5, "therein" should be ---wherein---.

Signed and Sealed this

Twenty-fifth Day of October, 1994

Attest:

BRUCE LEHMAN

Attesting Officer      Commissioner of Patents and Trademarks